United States Patent [19]
Boatner et al.

[11] Patent Number: 5,437,729
[45] Date of Patent: Aug. 1, 1995

[54] CONTROLLED REMOVAL OF CERAMIC SURFACES WITH COMBINATION OF IONS IMPLANTATION AND ULTRASONIC ENERGY

[75] Inventors: Lynn A. Boatner, Oak Ridge, Tenn.; Janet Rankin, Providence, R.I.; Paul Thevenard, Caluire; Laurence J. Romana, Gaudeloupe Antilles, both of France

[73] Assignee: Martin Marietta Energy Systems, Inc., Oak Ridge, Tenn.

[21] Appl. No.: 45,475

[22] Filed: Apr. 8, 1993

[51] Int. Cl.$^6$ ............................................. B08B 3/12
[52] U.S. Cl. ..................................... 134/1; 427/524; 427/526; 216/87; 216/101
[58] Field of Search .................... 134/1; 156/628, 643; 427/524, 526

[56] References Cited

U.S. PATENT DOCUMENTS

| | | | |
|---|---|---|---|
| 3,704,166 | 11/1972 | Cuomo et al. | 427/527 |
| 4,088,799 | 5/1978 | Kurtin | 427/526 |
| 4,296,144 | 10/1981 | Maby et al. | 427/523 |
| 4,450,041 | 5/1984 | Aklufi | 156/628 |
| 4,504,322 | 3/1985 | Adwalpalker et al. | 134/1 |
| 4,532,149 | 7/1985 | McHargue | 427/527 |
| 4,946,735 | 8/1990 | Lee et al. | 156/628 |
| 4,971,920 | 11/1990 | Miyashita et al. | 134/1 X |
| 4,999,083 | 3/1991 | Watanabe et al. | 156/628 |
| 5,147,465 | 9/1992 | Maruyama et al. | 134/1 |
| 5,240,506 | 8/1993 | Liers et al. | 134/1 |
| 5,262,392 | 11/1993 | Hung et al. | 156/628 |
| 5,286,340 | 2/1994 | Yates, Jr. et al. | 156/628 |

FOREIGN PATENT DOCUMENTS 0427193  5/1991  European Pat. Off. ............... 134/1

OTHER PUBLICATIONS

"Ion Implantation and Ultrasonic Cavitation 'Etching' of Ceranics" L. A. Boatner et al, American Ceramic Society Meeting, Apr. 12–16, 1992 (Abstract).

*Primary Examiner*—Upendra Roy
*Assistant Examiner*—Saeed Chaudhry
*Attorney, Agent, or Firm*—Earl L. Larcher; Shelley L. Stafford; Harold W. Adams

[57] ABSTRACT

A method for tailoring or patterning the surface of ceramic articles is provided by implanting ions to predetermined depth into the ceramic material at a selected surface location with the ions being implanted at a fluence and energy adequate to damage the lattice structure of the ceramic material for bi-axially straining near-surface regions of the ceramic material to the predetermined depth. The resulting metastable near-surface regions of the ceramic material are then contacted with energy pulses from collapsing, ultrasonically-generated cavitation bubbles in a liquid medium for removing to a selected depth the ion-damaged near-surface regions containing the bi-axially strained lattice structure from the ceramic body. Additional patterning of the selected surface location on the ceramic body is provided by implanting a high fluence of high-energy, relatively-light ions at selected surface sites for relaxing the bi-axial strain in the near-surface regions defined by these sites and thereby preventing the removal of such ion-implanted sites by the energy pulses from the collapsing ultrasonic cavitation bubbles.

16 Claims, 3 Drawing Sheets

CONTROLLED REMOVAL OF CERAMIC SURFACES WITH COMBINATION OF IONS IMPLANTATION AND ULTRASONIC ENERGY

BACKGROUND OF THE INVENTION

The present invention relates generally to a method for the selective removal of near-surface regions of ceramic material from a ceramic body. More particularly, the present invention is directed to a method for the controlled removal of such near-surface regions to predetermined nanometer depths by implanting ions in a selected surface location of the ceramic body to damage and strain the lattice structure of the ceramic material in the near-surface regions of the ceramic body and then contacting these ion-damaged near-surface regions with collapsing, ultrasonically-generated cavitation bubbles for removing ceramic material therefrom to the predetermined depth.

This invention was made with the support of the United States Government under contract No. DE-AC05-840R21400 awarded by the U.S. Department of Energy. The United States Government has certain rights in this invention.

Ceramic materials of single-crystal or polycrystalline form are commonly used as substrates in the manufacture or packaging of various electronic and optical components and systems such as semi-conducting devices, integrated circuits, superconductors, ferroelectric conductors, optical modulating devices, optical wave guides, electrical sensors, gauges, and the like. The ceramic substrates or bodies used in such application are frequently of a complex or composite construction and are often doped with suitable materials so as to incorporate electrically conductive and/or semiconductive or electrical insulating phases at specific surface and sub-surface regions in the ceramic substrate or body.

The utilization of ceramic materials in the manufacture of components and systems such as mentioned above, often requires that the surface of the ceramic substrate or body be altered or tailored by removing surface layers of thicknesses in the order of about 10–2000 nanometers and on a scale compatible with the processing or packaging required for the particular component or system. The removal of selected surface layers of electrically conductive or electrically insulating ceramic material from near-surface regions of ceramic bodies to desired depths such as for exposing a suitable electrical conducting or insulating surface has been previously achieved by employing techniques such as ultrasonic impact grinding with an abrasive such as boron carbide or the like or by using chemical etchants. Such impact grinding and chemical etching techniques have been found to have many drawbacks which detract from their use in removing selected surface layers of ceramic material from ceramic bodies. For example, with impact grinding techniques, the depth to which the surface layer is removed is often hard to control, especially in nanometer depths less than about 100 nanometers since the size of the abrasive particle is often of a particle size substantially greater than the desired depth of the surface layer to be removed from the ceramic article. Also, some of the abrasive particles are often imbedded in the ceramic surface so as to detract from the desired properties of the ceramic material. The use of presently known chemical etchants is often unsatisfactory for tailoring the surface of many ceramics due to particular properties and the nonuniform dissolution behavior of the ceramic materials. Chemical etchants subject the ceramic material to possible chemical reactions which could result in the removal or damage of heterogeneous adjacent material required by the electronic mechanism being fabricated from the ceramic material. Also, chemical etchants have been found to damage some ceramic material due to the relatively high temperatures generated during the chemical etching reaction.

SUMMARY OF THE INVENTION

Accordingly, it is a principal aim or objective of the present invention to provide a new and improved method for tailoring the surfaces of single crystal or polycrystalline ceramic materials of simple or composite form by removing surface monolayers or near-surface regions from selected locations or sites on bodies of ceramic material to predetermined depths in the range of about 10 to 2000 nanometers without suffering the problems or drawbacks heretofore encountered when using previously known ceramic surface altering or tailoring techniques such as described above.

Generally, the method of the present invention comprises the following steps: implanting ions in the ceramic material at a selected location on the surface of the ceramic body at a fluence sufficient to damage lattice structure within the ceramic material in near-surface regions at the selected location of the ceramic body and thereby produce bi-axial compressive strain and a mechanically metastable condition within the ion-damaged near-surface regions; immersing at least the ion-damaged surface regions of the ceramic body in a liquid medium; exciting the liquid medium with ultrasonic energy at a frequency sufficient to generate collapsible cavitation bubbles therein which produce energy pulses upon the collapse thereof with these energy pulses contacting and removing exposed surfaces of the ceramic material containing the ion-damaged near-surface regions; and, contacting exposed surfaces of the ceramic material containing the damaged lattice structure with the energy pulses from the collapsing cavitation bubbles for a duration sufficient to remove a surface layer of ceramic material of a predetermined thickness from the selected surface location of the ceramic body.

Another object of the present invention is to provide for the further tailoring of the surface of a ceramic body by first implanting in the aforementioned selected surface site or location a fluence of relatively heavy ions to a selected depth in the near-surface regions to provide the ion-damaged, mechanically metastable lattice structure and then implanting relatively light ions into these ion-damaged near-surface regions at one or more sites or surfaces of selected patterns at a fluence higher than that of the relatively heavy ions for effectively removing the metastable condition by stabilizing or relaxing the bi-axial strain in the lattice structure in the near-surface regions underlying the patterned surface site. By so implanting the fluence of lighter ions, the energy pulses from the collapsing ultrasonic cavitation bubbles remove only the near-surface regions of the ceramic material still under the influence of bi-axial strain so as to leave raised surfaces of desired patterns at selected sites on the ceramic body.

A further object of the present invention is to provide for the removal of patterned surface regions to preselected depths by implanting the lattice-damaging ions to a preselected depth and then removing all of the ion-damaged lattice structure or, in the alternative, by implanting the ions to a depth greater than the preselected depth and then removing the ion-damaged ceramic material by controlling the duration and/or the intensity of the ultrasonic cavitation process.

A still further object of the present invention is to substantially reduce or remove the bi-axial strain and restore the stability of the ion-damaged lattice structure remaining after the removal of the selected near-surface regions to that of the ceramic body apart from the ion-damaged near-surface regions by the step of annealing the ion-damaged ceramic material at a suitable elevated temperature.

Other and further objects of the present invention will become obvious upon an understanding of the illustrative method and embodiments about to be described or will be indicated in the appended claims, and various advantages not referred to herein will occur to one skilled in the art upon employment of the invention in practice. For example, while the invention as described herein is primarily directed to the controlled removal of ceramic material from near-surface regions of ceramic articles for purposes such as described above, it will appear clear that the method of the present invention could also be satisfactorily employed for preparing surfaces of ceramic materials for bonding or attachment to other materials such as by employing gluing, welding, or soldering techniques. The method of the present invention could be used for treating surfaces of electrically conducting ceramic composites such as electrodes or for improving the surface of catalytically-active composite ceramic materials.

For the purpose of this description and claims, the phrase "ceramic material" as used herein is intended to be descriptive of articles or bodies of material having semiconducting or electrically conducting properties primarily provided by inorganic, nonmetallic materials including, but not restricted to, oxides, carbides, fluorides, and nitrides. The ceramic material can be in the form of a single crystal with a surface orientation of [100], [110], [111], or any combination thereof or be of a polycrystalline form, and with near-surface regions being totally formed, or formed in part, of the ceramic material. Typically, such ceramic materials include $Al_2O_3$, $MgO$, $SiO_2$, $ZrO_2$, $ZnO$, $KTaO_3$, $CeO_2$, $KNbO_3$, $SrTiO_3$, $BaTiO_3$, $PbTiO_3$, $TiC$, $TiB_2$, $TiO_2$, $Si_3N_4$, or mixtures thereof. Also, for the purpose of this description the phrase "near-surface regions" as used herein is intended to refer to the exposed surface of the ceramic body and subsurface monolayers or regions underlying the exposed surface to a depth of about 2000 nanometers.

Preferred embodiments of the method of the invention have been chosen for the purpose of illustration and description. The preferred embodiments illustrated are not intended to be exhaustive nor to limit the invention to the precise steps shown. The preferred embodiments are chosen and described in order to best explain the principles of the invention and their application and practical use to thereby enable others skilled in the art to best utilize the invention in various embodiments of the method and modifications thereof as are best adapted to the particular use contemplated.

DETAILED DESCRIPTION OF THE INVENTION

As generally described above, the present invention is directed to a method for the controlled removal of surface layers or subsurface regions of ceramic material from selected locations on ceramic bodies or substrates with the controlled removal being provided to a depth or thicknesses in the range of about 10 to 2000 nanometers (nm). This controlled removal of ceramic material is achieved by employing an ion implantation step followed by the step of contacting the ion-implanted ceramic material with collapsing ultrasonically formed cavitation bubbles which remove the ion-implanted surface region. In the present method, selected surface regions of the ceramic body of a single crystal or polycrystalline structure in the form of a simple or complex composite, as described above, is bombarded or implanted with energetic ions at a sufficient fluence and intensity to damage the lattice structure in near-surface regions of the ceramic material to a selected depth. This damage of the lattice structure occurs through well known electronic and/or displacing processes which cause a bi-axial compression strain to occur within the implanted lattice structure and thereby produce a relatively unstable or metastable condition to be present within the ion-implanted near-surface regions. The removal of all or a selected portion of the ion-damaged ceramic material is achieved by contacting the surface of the ceramic body containing the ion-damaged near-surface regions with energy pulses from the collapsing ultrasonically generated cavitation bubbles in a liquid medium for removing from the ceramic body all or part of the ion-damaged near-surface regions of the ceramic material having the unstable, bi-axially strained lattice structure.

The maximum depth of the near-surface regions damaged by the implantation of the ions is readily controlled by selectively regulating the duration and the energy used for implanting the ions with respect to elemental properties existing in the ceramic material, such as electronic interactions or ion scattering cross-sections with various elements contained in the ceramic material, which determine the nature of the ion interactions with the ceramic material. Practical depths for implanting the ions are normally in the range of about 10 to 1000 nm with such ion-implantation depths varying with the mass of the implanted ion and being achieved by using ion implanting energies in the range of about 20 to 2,000 keV, but such ions can be implanted to depths up to about 2000 nm by implanting the ions at energy levels up to about 6,000 keV depending on the energy and mass of the implanted ion.

By employing a mask of a preselected shape or configuration at a predetermined location on the surface of the ceramic article, the ion implantation and the subsequent removal of the resulting ion-damaged ceramic material by the collapsing ultrasonic cavitation bubbles can be provided in a controlled pattern to a preselected depth in the near-surface regions since the ions can be readily directed at an angle perpendicular or at any selected angle to the unmasked surface of ceramic article. Also, instead of using a mask for patterning the surface of the ceramic body that is to be provided with the ion implant, such surface patterning may be achieved by using conventional ion-beam collimating practices or by steering the ion beam with electromagnets.

Figure 1:
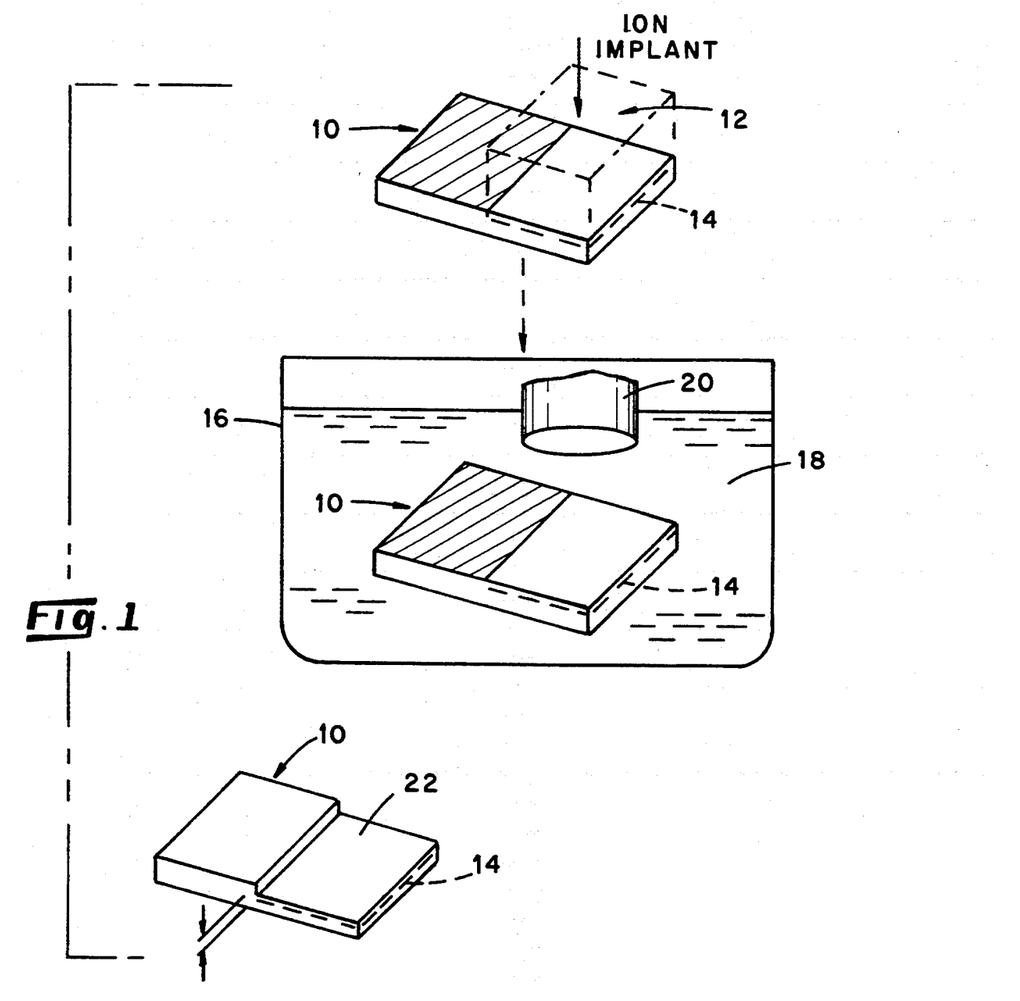
FIG. 1 is a schematic flow diagram illustrating, in sequence, the ion planting of lattice damaging ions in subsurface regions of a ceramic substrate, and the removal of the ion-implanted subsurface regions by collapsing ultrasonic cavitation bubbles to provide a ceramic substrate.
Figure 2:
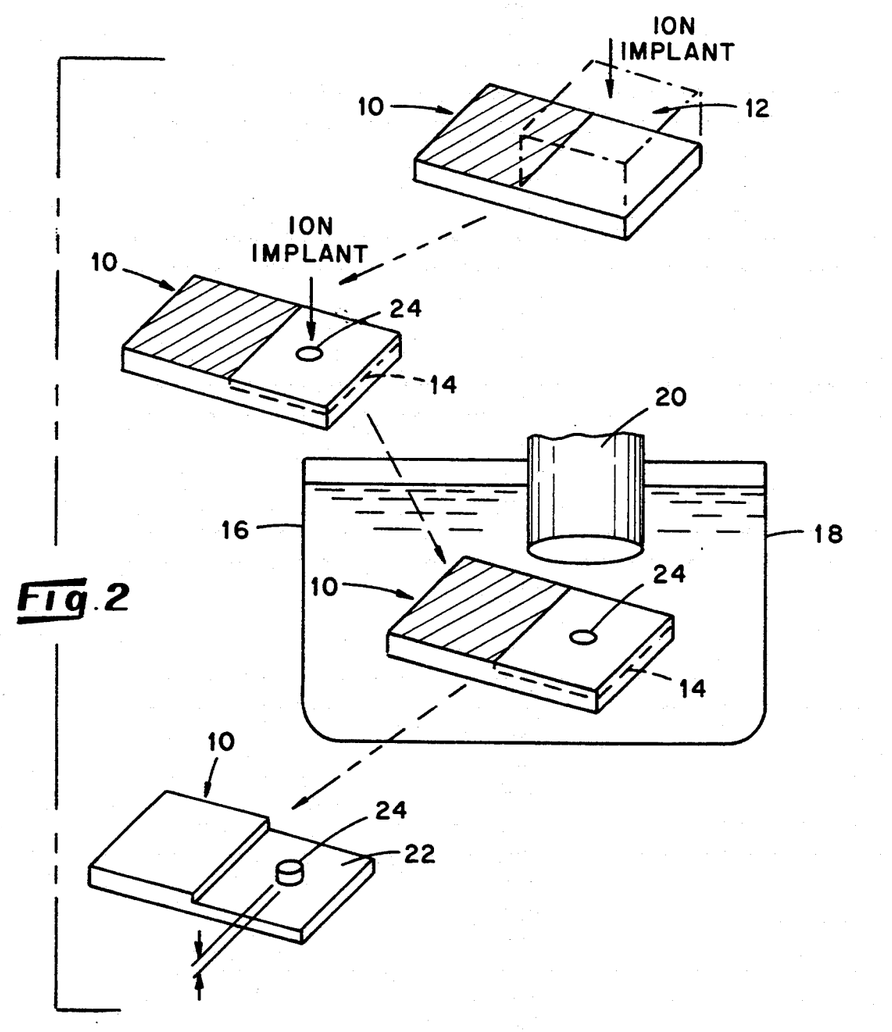
FIG. 2 is a schematic flow diagram generally corresponding to that of FIG. 1 but showing a further embodiment of the present invention wherein a patterned section of the ion-implanted subsurface region is implanted with lighter ions at a higher fluence to stabilize the ceramic material underlying the patterned section for preventing removal thereof by the collapsing ultrasonic cavitation bubbles.

The ion implantation steps in the present invention as used in the embodiments illustrated in FIGS. 1 and 2 can be provided by employing any commercially available ion accelerator as used in conventional ion implanting practices. In the present invention, the ions are implanted at ambient temperatures but some heating of the ceramic substrate may occur during such ion implantation due to interactions of the ions with the lattice structure and elements present in the ceramic material.

The ions used for damaging the lattice structure of the ceramic material for the purpose of creating the required biaxial compression strain and the formation of a metastable condition in the ion-implanted near-surface regions of the ceramic material may be of any suitable element or combination of elements capable of effecting the necessary level of biaxial strain in such near-surface regions. In some instances it may be desired to use lattice-damaging ions which have specific electronic properties that can be beneficially emplaced in the surface region of the ceramic material underlying that removed by the ultrasonic cavitation bubbles so as to customize the ceramic material for a specific use. The particular ions implanted in the near-surface regions for the purpose of damaging and bi-axially straining the lattice structure in the ceramic material are not critical to the present invention but are necessarily of a relatively heavy element or combination of elements since ions of elements lighter than about beryllium are generally inefficient for adequately damaging and bi-axially straining the lattice structure of the ceramic material for the effective removal of the ion-damaged near-surface regions at fluences in the range of about $10^{-15}$–$10^{17}$ ions/cm$^2$. Fluences greater than about $10^{17}$ ions/cm$^2$ have not been found to provide the desired level of bi-axial strain required for rendering the ion-damaged near-surface regions subject to removal by the energy pulses from the collapsing cavitation bubbles, since, in fact, the use of a fluence sufficient to convert the ion-damaged near-surface regions to an amphorous state will not produce the required axial strain. This fluence varies depending on the specific structural and bonding properties of the particular ceramic material. Ions such as singly charged potassium (K$^+$) or doubly charged krypton (Kr$^{++}$) as well as xenon (Xe$^{++}$), lead (Pb$^{++}$), barium (Ba$^{++}$), or other suitable ions as known to those skilled in the art may be satisfactorily employed for this purpose. Also, if it is desired to use the implanted ions for providing certain electrical or electrical insulating properties within the ceramic body at locations underlying the removed near-surface regions, ions of elements such as arsenic, antimony, tin, or any other suitable dopant ions as known to those skilled in the art may be utilized for creating the required bi-axial strain in the lattice structure of the ceramic material. The energy used for implanting these ions provides a mechanism for controlling the maximum depth to which the ions are implanted at the selected fluence into the near-surface regions of the ceramic material. With the types of ions described above, including the preferred K$^+$ and Kr$^{++}$ ions, the ion implant energy required is less than about 1 MeV. Usually an implant energy of about 100–400 keV is sufficient to implant the bi-axial strain producing ions at the selected fluence to a depth in the range of about 10 to 1000 nanometers. The K$^+$ and Kr$^{++}$ are preferably implanted at energies in the range of about 50 to about 500 keV and about 100 to about 800 keV, respectively. However, as pointed out above, the ions can be implanted to greater depths up to about 2000 nm in the near-surface region by accelerating the ions at a higher energy level of about 1,000 to greater than 6,000 keV depending on the density and composition of the ceramic material being implanted with this depth/energy relationship being readily calculated accurately by conventional methods known to those skilled in the art.

The selected removal of the ion-damaged near-surface regions or monolayers to a total depth to which adequate strain producing ion damage is present can be readily achieved by varying the length and the intensity to which the ion-implanted surface is subjected to impacting energy pulses provided by the collapsing cavitation bubbles. In accordance to the present invention it is possible to remove ion-damaged near-surface regions to a controlled depth that can be readily varied from an effective minimum depth of a few nanometers to essentially the full depth of the implanted ions, which depth represents the limiting or maximum depth for controlled removal of the surface material. In carrying out this step of the present invention, the energy pulses from the collapsing ultrasonic cavitation bubbles are provided at a level substantially less than that which would be required to damage the unimplanted ceramic material contiguous to the implanted region.

To effect the removal of ion-damaged ceramic material, the entire ceramic body containing the ion-damaged near-surface regions or at least the ion-damaged portion of the ceramic body is immersed in a suitable liquid medium used for conducting the ultrasonic cavitation step. The liquid medium utilized for this step is preferably inert to the particular ceramic material being treated and can be any liquid in which the ceramic material is neither chemically reactive or subject to dissolution. Liquids suitable for use in the ultrasonic cavitation step include water and various alcohols such as isopropyl and butyl, as well as other organic liquids such as hexane or ether. Water provides a suitable liquid medium for the ultrasonic cavitation step with ceramics such as alumina or zirconia but is not particularly suitable for other ceramic materials such as magnesium oxide since this ceramic material exhibits some solubility in water.

If a mask is utilized for providing the particular ion implant pattern on the surface of the ceramic body, the mask is preferably removed from the ceramic body prior to the immersion thereof into the liquid medium. Further, a small amount, about one to six volume percent, of a common detergent such as liquid soap may be added to the liquid medium for the purpose of promoting or enhancing the formation of the collapsing cavitation bubbles.

While in the bath of the liquid medium, the implanted as well as the unimplanted portions of the ceramic body are subjected to the energy pulses from the collapsing ultrasonic cavitation bubbles. These bubbles are readily generated in the liquid medium by ultrasonically exciting the liquid medium at a frequency in the range of about 20 kHz up to about 1.0 MHz while the size of the bubbles decreases with increasing excitation frequency. Preferably, a frequency in the range of about 20 to 100 kHz is employed for the generation of the cavitation bubbles. After these ultrasonically generated bubbles are formed, they implosively collapse to create shock waves at high pressures up to several hundred atmospheres in the liquid medium contiguous to the collapsing bubbles. Also, cavitation bubbles collapsing in close proximity to the ion-damaged surface regions of the ceramic body do so in an asymmetric manner so as to produce a liquid jet which, at a speed of about 400 km/hr, traverses the collapsing bubble and impacts against the surface of the ceramic body. These energy pulses provided by the collapsing shock waves either individually or in concert with the forces associated with the liquid jets provide a sufficient level of impact against ion-implanted, biaxially strained surfaces to mechanically etch successive layers of the ion-damaged ceramic material from the ceramic body.

The contacting of the ceramic body with these energy pulses from the collapsing cavitation bubbles is maintained for a duration sufficient to effect the removal of the ceramic material from the surface of the ceramic body to the depth desired for the tailoring of the ceramic body. This duration is dependent upon the amount of ultrasonic energy used for the bubble formation since increasing excitation energy increases the removal rate of the ion-damaged ceramic material. Thus, with a total input excitation energy of approximately 125 watts, a duration of about 5 minutes is usually sufficient to remove about 100 nm of a ceramic material such as magnesium oxide from the near-surface regions of a ceramic body. Of course, with different types of ceramic materials, such as identified above, the duration of this ceramic material removing step as well as the ultrasonic excitation energy and frequency used can be readily ascertained to provide the most efficient removal rate.

After removing the ion-damaged near-surface regions to the desired depth, any metastable, ion-damaged near-surface regions remaining in the ceramic body may be stabilized to a stability level essentially corresponding to that of the unimplanted regions of the ceramic body by annealing these near-surface regions in air or vacuum at a temperature in the range of about 800° to 1200° C. This annealing step significantly, if not entirely, partially relaxes the bi-axial strain and restores the stability of the ceramic material. Thus, by implanting these ions to a depth greater than required for the surface removal and by selectively choosing the particular ion used to provide the inner-surface damage required for the removal of the near-surface regions, the ion-damaged near-surface regions remaining in the ceramic body after the ultrasonic cavitation step can be annealed to customize or tailor the ceramic material so as to provide specific electronic properties.

In order to provide a more facile understanding of the method of the present invention, examples of preferred embodiments are set forth below and illustrated in FIGS. 1 and 2. In these examples a magnesium oxide wafer of a single crystal [100], [111], or [110] orientation is surface-tailored by two embodiments of the method the present invention for the purpose of illustration. Of course, other ceramic materials of single crystal or polycrystalline form can be similarly surface-tailored by practicing the method steps set forth in these examples.

EXAMPLE 1

Figure 1A:
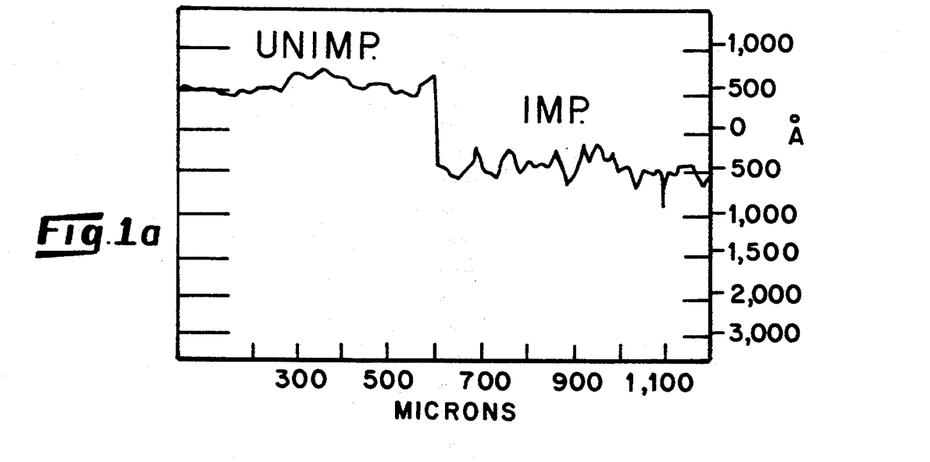
FIG. 1a is a graph illustrating the surface profile of the ceramic substrate of FIG. 1 after the removal of the ion-implanted subsurface regions.

With reference to the sequence of steps illustrated in FIG. 1, approximately one-half of a polished surface on a magnesium oxide body 10 is covered with a mask (not shown) and the remaining one-half of the magnesium oxide body is bombarded with a stream of $K^+$ ions generally shown at 12 from an ion-implantation device (not shown) at an implant energy of 150 keV to provide a dose or fluence of $5 \times 10^{16}$ ions/cm$^2$ in near-surface regions of the ceramic body to a depth of 200 nm as generally indicated by the dotted line 14. Upon completion of ion implantation, the ceramic body 10 including the unimplanted and implanted regions is inserted into a vessel 16 and immersed in a bath 18 of isopropyl alcohol to which 5 vol/% of liquid soap was added to promote the formation of the cavitation bubbles. An ultrasonic generator as generally shown at 20 is used to excite the bath 18 of alcohol with an ultrasonic frequency of 20 kHz for creating the cavitation bubbles (not shown) within the alcohol bath 18. After subjecting the ceramic body 10 to the mechanical etching provided by the collapsing ultrasonic cavitation bubbles at this excitation frequency for a duration of 5 minutes, near-surface regions of ceramic material were removed from the ceramic body 10 to a depth of about 100 nm (100 angstrom) as indicated by the relief 22. The results of an examination of the surface-tailored ceramic by the profilometer is shown in the graph of FIG. 1a where the surface of the relief 22 is substantially as smooth as the unimplanted surface of the ceramic body.

An increase in the duration of contacting the ceramic body with the collapsing ultrasonic cavitation bubbles or an increase in the ultrasonic energy used for forming the bubbles would result in removal of additional near-surface regions from the ion-damaged portion of the ceramic body 10. For example, by using the same 20 kHz excitation frequency but subjecting the ceramic body 10 to the collapsing cavitation bubbles for a duration of 10 to 12 minutes would increase depth of the removal of ion-damaged near-surface regions to a depth of between 100 and 150 nm. As shown in FIG. 1 the unimplanted surface of the ceramic body 10 is unaffected by the collapsing ultrasonic cavitation bubbles.

A further embodiment of the method of the present invention is described in Example 2 and generally shown in FIG. 2. In this embodiment selected portions of the metastable, ion-implanted near-surface regions, as described above, are adequately stabilized to prevent their removal by the "mechanical etching" action of the collapsing ultrasonic cavitation bubbles, thus permitting further patterning of the ceramic body or substrate. Generally, this selective stabilization of the metastable, ion-damaged lattice structure in the ceramic material is achieved by implanting a relatively high fluence of high energy ions formed of elements lighter than that used for the damaging and straining of the lattice structure in the near-surface regions of the ceramic material. These high energy ions are implanted at an energy greater than 1 MeV, preferably in the range of about 1 to about 3 MeV, at a fluence of at least about $10^{17}$ ions/cm$^2$ and preferably at a fluence in the range of $10^{17}$–$10^{20}$ ions/cm$^2$. These high energy ions at the indicated fluence interact with the lattice structure of the ion-damaged ceramic material in an electronic manner so as to relax or offset the bi-axial compression strain, and thereby sufficiently stabilize the ion-damaged ceramic material to prevent removal thereof by the energy forces generated by the collapsing ultrasonic cavitation bubbles. This relaxation of the bi-axial strain in patterned near-surface regions of the ceramic material is provided by using relatively light ions such as helium, lithium, beryllium, and the like rather than the heavier ions used for creating the bi-axial strain in the lattice structure since the energy loss for very light, high-energy ions occurs primarily through electronic interactions rather than by displacive nuclear collisions.

The relaxation of the ion-damaged and strained ceramic material in the near-surface regions can be in any selective pattern and to any selected depth that is readily achievable by known ion implantation techniques. The desired surface pattern can be provided by using a suitable mask over the previously ion-implanted areas or by directing the ion beam using beam-collimating techniques or by steering the high-energy ion beam with electromagnets. The selective patterning by collimating the beam or steering the high energy beam with electromagnets provides for effecting any desired pattern on the a surface of the ceramic material including such patterns which would be normally difficult to obtain by using conventional masking techniques.

In addition to the patterning of the ion-damaged surface of the ceramic body by implanting the ceramic material stabilizing ions, this embodiment of the invention can also be used for further tailoring the surface of the ceramic body. For example, in the fabrication of a ceramic substrate, a selected portion of the ion-damaged near-surface regions of the ceramic material can be removed to a selected depth by the collapsing cavitation bubbles, and then the remaining ion-damaged near-surface regions in selected locations can be then implanted with the strain relaxing ions. Further sculpturing of the surface of the ceramic substrate can then be provided by removing additional ion-damaged ceramic material by subjecting the ceramic substrate to a second mechanical etching treatment with the cavitation bubbles. By employing this staged surface tailoring procedure, multiple surface levels can be provided on the ceramic substrate for providing selected functions.

Also, relatively light ions of hydrogen, helium, or lithium may be implanted in a predetermined pattern in near-surface regions of the ceramic body to relax the bi-axially strained lattice structure of the ceramic material while providing the ceramic body with selected electrical properties which may be particularly beneficial in the manufacture of various electronic systems or components.

EXAMPLE 2

Figure 2A:
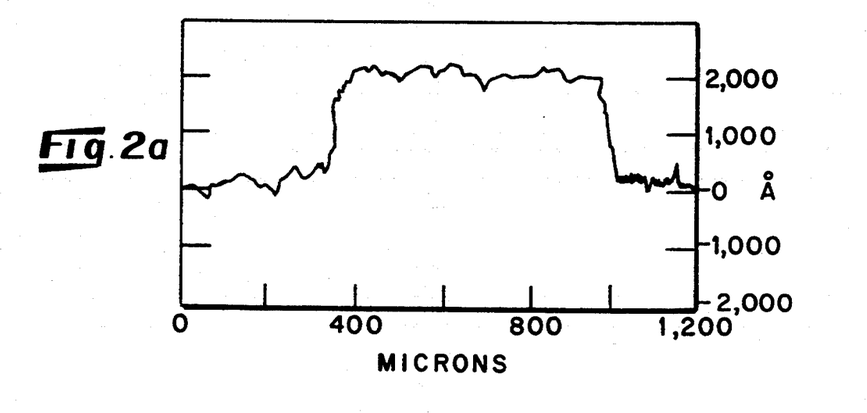
FIG. 2a is a graph illustrating the surface profile of the ceramic substrate of FIG. 2 after the removal of the unstabilized ceramic material.

In this example as shown in FIG. 2, the selected surface of the magnesium oxide substrate 10 is implanted with K+ ions as in Example 1 described above. Following the implantation of the bi-axial strain-producing K+ ions, a selected patterned surface site, as generally shown by the circular pattern or dot 24 on the ion-damaged near-surface region 14 of the ceramic body 10, is implanted with a fluence of high energy He+ ions at an implant energy of 2.0 MeV by directing the ion beam through a collimating orifice (not shown). These He+ ions are implanted to a depth in the near-surface regions at least as great as that of the K+ ion-damaged surface regions so as to prevent undercutting of the patterned surface 24 during the removal of the ceramic material by the collapsing cavitation bubbles. After implanting the He+ ions, the ceramic body 10 as in Example 1 is immersed in a bath 18 of isopropyl alcohol, which is then excited by the ultrasonic energy generator 20 operating at a frequency of 20 kHz. After approximately 15 minutes in the excited bath 18, the ion-damaged near-surface regions of the ceramic body are removed to a depth of $\approx 200$ nm or 2000 angstroms as generally indicated by the relief 22 and shown in the graph of FIG. 2a while the circular pattern defined by the dot 24 containing the implanted He+ ions is unaffected by the mechanical etching action of the collapsing ultrasonic bubbles. The profilometer trace shown in the graph of FIG. 2a also illustrates that the high energy He+ ion-implanted near-surface regions defined by the dot 24 are intact while the surrounding near-surface regions representing the metastable, K+ ion-damaged near-surface regions have been removed to the depth of about 200 nm or 2000 angstroms. A longer exposure time to the mechanical etching action of the ultrasonic cavitation bubbles against the ion-damaged near-surface regions or by using a higher excitation frequency would further increase the depth of the relief 22 encompassing the dot 24 containing the implanted He+ ions.

Figure 3:
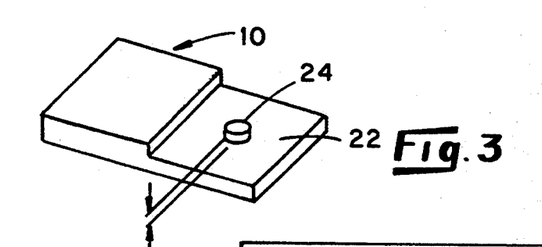
FIG. 3 is a schematic diagram illustrating the surface profile of the ceramic substrate upon completion of the removal of ion-damaged near-surface regions by employing the ultrasonic cavitation step.
Figure 3A:
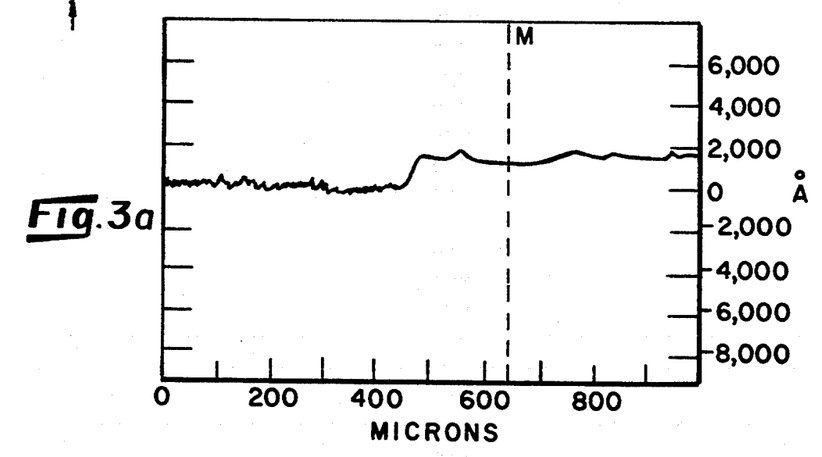
FIG. 3a is a graph illustrating the surface profile of the ceramic substrate of FIG. 3 after completion of the removal of the ion-damaged near-surface regions.
Figure 4:
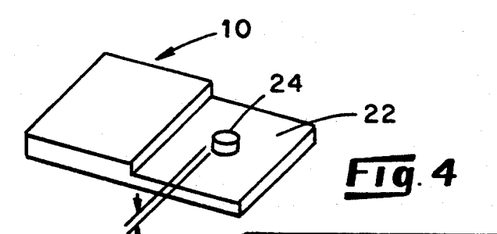
FIG. 4 is another schematic diagram including a graph illustrating at a smaller scale than in FIG. 3 the surface profile of the ceramic substrate upon completion of the ultrasonic cavitation step.
Figure 4A:
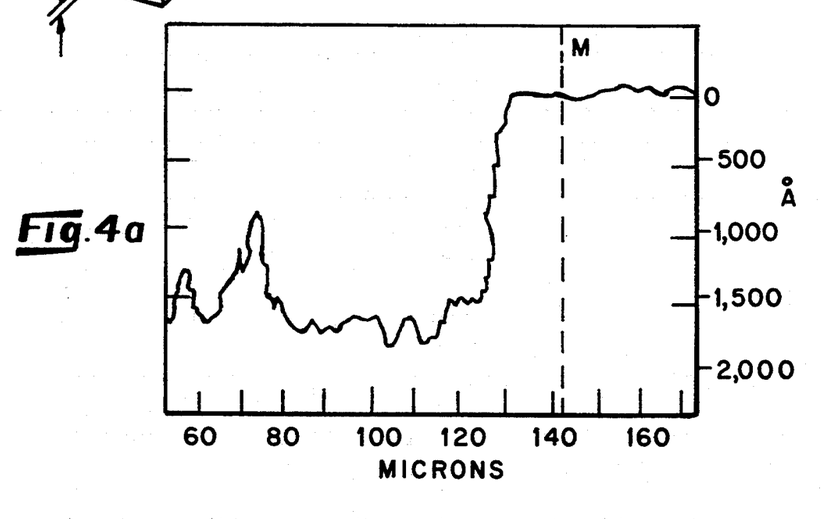
FIG. 4a is a graph illustrating the surface profile of the ceramic substrate of FIG. 4 after completion of the ultrasonic cavitation step.

The method of the present invention for tailoring surfaces on bodies of ceramic material by the controlled removal of near-surface regions of the ceramic to selected depths provides mechanically etched surfaces that are sufficiently smooth for most electronic applications. For example, for the mechanically etched magnesium oxide bodies 10 shown in FIGS. 3 and 4 and as shown in the profilometer traces illustrated in FIGS. 3a and 4a, respectively, the exposed surface of the He+-ion-implanted spot 24 on a magnesium oxide body 10 as used in Examples 1 and 2 is smooth while the surface 22 of the ceramic body 10 remaining after the near-surface regions have been removed is relatively smooth with a surface finish of about 100 angstroms, which smoothness is normally adequate for most electronic applications. Of course, with a ceramic material different than magnesium oxide the smoothness of the mechanically etched surface may be smoother or rougher depending upon the particular composition and type of ceramic material being surface tailored by the method of the present invention.

It will be seen that the present invention provides a mechanism for the nano-scale tailoring or patterning of surfaces of ceramic bodies by the selective removal of near-surface regions of the ceramic material in a manner significantly more accurate and less damaging to the ceramic material than heretofore achievable.

What is claimed is:

1. A method for removing a surface layer of ceramic material of a thickness in the range of about 10 to 2000 nanometers from a selected surface region of a ceramic body, comprising the steps of implanting ions in the ceramic material at a selected location on the surface of the ceramic body at a fluence sufficient to damage lattice structure within the ceramic material in near-surface regions at said location for producing a bi-axial compressive strain and a metastable condition within the ion-damaged lattice structure, immersing at least the ion-damaged surface regions of the ceramic body in a liquid medium, and exciting the liquid medium with ultrasonic energy at a frequency sufficient to generate collapsible cavitation bubbles therein for contacting exposed surfaces of the ceramic material containing the damaged near-surface regions with energy pulses produced by collapsing cavitation bubbles for removing ceramic material containing ion-damaged lattice structure from near-surface regions of the ceramic body, and contacting exposed surfaces of the ceramic material containing the damaged lattice structure with the collapsing cavitation bubbles for a duration sufficient to remove a surface layer of ceramic material of said thickness from the selected surface regions of the ceramic body.

2. A method for removing a surface layer of ceramic material of a thickness in the range of about 10 to 2000 nanometers from a selected surface region of a ceramic body as claimed in claim 1, wherein the ions are implanted into the near-surface regions of the ceramic body to a depth generally corresponding to said thickness, and wherein the duration of contacting the exposed surfaces of the ceramic material containing the damaged lattice structure with the collapsing cavitation bubbles is sufficient to remove substantially all of the ion-damaged ceramic material from the ceramic body.

3. A method for removing a surface layer of ceramic material of a thickness in the range of about 10 to 2000 nanometers from a selected surface region of a ceramic body as claimed in claim 1, wherein the ions are implanted into the near-surface regions of the ceramic body to a depth greater than said thickness, and wherein the duration of contacting the exposed surfaces of the ceramic material containing the damaged lattice structure with the collapsing cavitation bubbles is sufficient to remove from the ceramic body a near-surface region of the ion-damaged ceramic material corresponding to said thickness.

4. A method for removing a surface layer of ceramic material of a thickness in the range of about 10 to 2000 nanometers from a selected surface region of a ceramic body as claimed in claim 3, including the additional step of annealing ceramic material containing the ion-damaged lattice structure that remains after removing the surface layer of said thickness for removing the bi-axial compressive strain from the ion-implanted lattice structure.

5. A method for removing a surface layer of ceramic material of a thickness in the range of about 10 to 2000 nanometers from a selected surface region of a ceramic body as claimed in claim 1, wherein the ceramic material is polycrystalline or a single crystal with a surface orientation of [100], [110], [111], or a combination thereof, and wherein the ceramic material is $Al_2O_3$, MgO, $SiO_2$, $ZrO_2$, ZnO, $KTaO_3$, $CeO_2$, $KNbO_3$, $SrTiO_3$, $BaTiO_3$, $PbTiO_3$, TiC, $TiB_2$, $TiO_2$, $Si_3N_4$, or a combination thereof.

6. A method for removing a surface layer of ceramic material of a thickness in the range of about 10 to 2000 nanometers from a selected surface region as claimed in claim 1, wherein the ceramic material is polycrystalline or a single crystal with a surface orientation of [100], [110], [111], or a combination thereof, and wherein the fluence of the ions implanted into the surface of the ceramic material is insufficient to convert the near-surface regions of the crystalline ceramic material to an amphorous state.

7. A method for removing a surface layer of ceramic material of a thickness in the range of about 10 to 2000 nanometers from a selected surface region of a ceramic body as claimed in claim 6, wherein the fluence is in the range of about $10^{15}$ to $10^{17}$ ions/cm$^2$.

8. A method for removing a surface layer of ceramic material of a thickness in the range of about 10 to 2000 nanometers from a selected surface region of a ceramic body as claimed in claim 7, wherein the thickness of the near-surface regions of the ceramic material removed from the ceramic body corresponds to at least said selected depth of the damaged lattice structure of the ceramic material.

9. A method for removing a surface layer of ceramic material of a thickness in the range of about 10 to 2000 nanometers from a selected surface region of a ceramic body as claimed in claim 1, wherein the ions are K+ ions implanted at a fluence in the range of about $10^{15}$ to $10^{17}$ ions/cm$^2$, and wherein K+ ions are implanted at an ion implant energy in the range of about 1,000 to 2,000 keV to damage the lattice structure in the near-surface regions up to a depth of about 2000 nanometers.

10. A method for removing a surface layer of ceramic material of a thickness in the range of about 10 to 2000 nanometers from a selected surface region of a ceramic body as claimed in claim 1, wherein the ions are K++ ions implanted at a fluence in the range of about $10^{15}$ to $10^{17}$ ions/cm$^2$, and wherein K++ ions are implanted at a ion implant energy in the range of about 1,000 to 2,000 keV to damage the lattice structure in the near-surface regions up to a depth of about 2000 nanometers.

11. A method for removing a surface layer of ceramic material of a thickness in the range of about 10 to 2000 nanometers from a selected surface region of a ceramic body as claimed in claim 1, including the additional step of masking exposed surface regions of the ceramic body contiguous to said location on the surface of the ceramic body for defining said location.

12. A method for removing a surface layer of ceramic material of a thickness in the range of about 10 to 2000 nanometers from a selected surface region of a ceramic body as claimed in claim 1, wherein the liquid medium is inert to the ceramic material, and wherein the ultrasonic energy is of an intensity in the range of about 50 to 200 watts/cm$^2$.

13. A method for removing a surface layer of ceramic material of a thickness in the range of about 10 to 2000 nanometers from a selected surface region of a ceramic body as claimed in claim 1, including the additional step of adding a sufficient concentration of detergent to the liquid medium for promoting the formation of the cavitation bubbles during the excitation of the liquid medium by the ultrasonic energy.

14. A method for removing a surface layer of ceramic material of a thickness in the range of about 10 to 2000 nanometers from a selected surface region of a ceramic body as claimed in claim 1, wherein the implanted ions are of a first element implanted at an ion implant energy less than 1.0 MeV, and including the additional step of implanting ions of a second element that is lighter than the first element to a selected depth in at least one selected location in the near-surface regions containing the ion-damaged lattice structure at an ion implant energy greater than 1.0 MeV and a fluence sufficient to adequately relax the biaxial strain and for preventing the removal of the ceramic material from said at least one location by the collapsing ultrasonic cavitation bubbles.

15. A method for removing a surface layer of ceramic material of a thickness in the range of about 10 to 2000 nanometers from a selected surface region of a ceramic body as claimed in claim 14, wherein the ions of the first element are $K^+$, $Kr^{++}$, $Xe^{++}$, $Pb^{++}$, or $Ba^{++}$ implanted at a fluence in the range of about $10^{15}$ to $10^{17}$, and wherein the ions of the second element are $He^+$, $H^+$, or $Li^+$ implanted at fluence of at least $10^{17}$ ions/cm$^2$.

16. A method for removing a surface layer of ceramic material of a thickness in the range of about 10 to 2000 nanometers from a selected surface region as claimed in claim 14, wherein the ion implant energy for the ions of the first element is in the range of about 100–400 keV, and wherein the ion implant energy for the ions of the second element is in the range of 1.0 to about 2.0 MeV.

* * * * *